United States Patent
Bangert et al.

(10) Patent No.: US 11,718,904 B2
(45) Date of Patent: Aug. 8, 2023

(54) MASK ARRANGEMENT FOR MASKING A SUBSTRATE IN A PROCESSING CHAMBER, APPARATUS FOR DEPOSITING A LAYER ON A SUBSTRATE, AND METHOD FOR ALIGNING A MASK ARRANGEMENT FOR MASKING A SUBSTRATE IN A PROCESSING CHAMBER

(71) Applicant: Applied Materials, Inc., Santa Clara, CA (US)

(72) Inventors: Stefan Bangert, Steinau (DE); Tommaso Vercesi, Aschaffenburg (DE); Daniele Gislon, Santa Maria di Sala-Venice (IT); Oliver Heimel, Wabern (DE); Andreas Lopp, Freigericht (DE); Dieter Haas, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1022 days.

(21) Appl. No.: 16/422,794

(22) Filed: Jun. 26, 2019

(65) Prior Publication Data
US 2019/0301002 A1     Oct. 3, 2019

Related U.S. Application Data

(63) Continuation of application No. 15/534,826, filed as application No. PCT/EP2014/077257 on Dec. 10, 2014, now abandoned.

(51) Int. Cl.
*H01L 21/67* (2006.01)
*C23C 14/04* (2006.01)
(Continued)

(52) U.S. Cl.
CPC ............ *C23C 14/042* (2013.01); *C23C 14/56* (2013.01); *C23C 16/042* (2013.01);
(Continued)

(58) Field of Classification Search
CPC ..... C23C 14/042; C23C 14/56; C23C 16/042; C23C 16/4587; C23C 14/12; G03F 1/38;
(Continued)

(56) References Cited

U.S. PATENT DOCUMENTS 5,904,958 A    5/1999   Dick et al.
7,194,197 B1   3/2007   Wendt et al.
(Continued)

FOREIGN PATENT DOCUMENTS

CN    1443026 A    9/2003
CN    1965420 A    5/2007
(Continued)

OTHER PUBLICATIONS

Korean Notice of Allowance dated Aug. 7, 2020 for Application No. 10-2019-7025762.
(Continued)

*Primary Examiner* — Mohammed Shamsuzzaman
(74) *Attorney, Agent, or Firm* — Patterson & Sheridan, LLP

(57) ABSTRACT

A mask arrangement for masking a substrate in a processing chamber is provided. The mask arrangement includes a mask frame having one or more frame elements and is configured to support a mask device, wherein the mask device is connectable to the mask frame; and at least one actuator connectable to at least one frame element of the one or more frame elements, wherein the at least one actuator is configured to apply a force to the at least one frame element.

23 Claims, 8 Drawing Sheets

(51) Int. Cl.

| | | |
|---|---|---|
| *C23C 16/04* | (2006.01) | |
| *C23C 16/458* | (2006.01) | |
| *G03F 1/38* | (2012.01) | |
| *C23C 14/56* | (2006.01) | |
| *H01L 21/673* | (2006.01) | |
| *H01L 21/677* | (2006.01) | |
| *G01F 1/42* | (2006.01) | |
| *H10K 71/16* | (2023.01) | |

(52) U.S. Cl.
CPC ............ *C23C 16/4587* (2013.01); *G03F 1/38* (2013.01); *H01L 21/67346* (2013.01); *H01L 21/67712* (2013.01); *G01F 1/42* (2013.01); *H10K 71/166* (2023.02)

(58) Field of Classification Search
CPC ......... H01L 21/67346; H01L 21/67712; H01L 51/0011; H01L 21/67721; H01L 21/68728; G01F 1/42
See application file for complete search history.

(56) References Cited

U.S. PATENT DOCUMENTS

| | | | |
|---|---|---|---|
| 2007/0163996 A1 | 7/2007 | Horiguchi | |
| 2009/0311427 A1* | 12/2009 | Marcanio ............. | H05K 3/1225 29/829 |
| 2010/0173067 A1 | 7/2010 | Ukigaya et al. | |
| 2011/0027462 A1 | 2/2011 | Hwang et al. | |
| 2012/0235036 A1* | 9/2012 | Hatakeyama ........... | H01J 37/20 250/310 |
| 2015/0068456 A1 | 3/2015 | Kuriyama et al. | |
| 2020/0083453 A1* | 3/2020 | Zang ....................... | H01L 51/56 |
| 2020/0220114 A1* | 7/2020 | Ogata ................. | H01L 51/0011 |

FOREIGN PATENT DOCUMENTS

| | | | | | |
|---|---|---|---|---|---|
| CN | 101538698 A | 9/2009 | | | |
| CN | 101603167 A | 12/2009 | | | |
| CN | 103094492 A | 5/2013 | | | |
| CN | 103668051 A | 3/2014 | | | |
| CN | 104128720 A | 11/2014 | | | |
| CN | 104169455 A | 11/2014 | | | |
| JP | 2005109488 A | 4/2005 | | | |
| JP | 2006310183 A | 11/2006 | | | |
| JP | 2007-291461 A | 11/2007 | | | |
| JP | 2007291461 A | * | 11/2007 | ............. | C23C 14/50 |
| JP | 2009127128 A | 6/2009 | | | |
| JP | 2012204328 A | 10/2012 | | | |
| JP | 2013093279 A | 5/2013 | | | |
| JP | 2013093279 A | * | 5/2013 | ............. | H01L 51/56 |
| JP | 2017057485 A | 3/2017 | | | |
| JP | 2018003142 A | 1/2018 | | | |
| JP | 2019039072 A | 3/2019 | | | |
| JP | 2019083311 A | 5/2019 | | | |
| KR | 1322530 B1 | 10/2013 | | | |
| KR | 10-1979149 B1 | 5/2019 | | | |
| TW | 201443254 A | 11/2014 | | | |
| WO | 2012043150 A1 | 4/2012 | | | |
| WO | 2013150699 A1 | 10/2013 | | | |
| WO | 2014112512 | 7/2014 | | | |
| WO | 2017222009 | 12/2017 | | | |

OTHER PUBLICATIONS

Chinese Office Action dated Oct. 12, 2020 for Application No. 201480084006.X.
Chinese Office Action dated Sep. 9, 2019 for Application No. 201480084006.X.
Chinese Office Action dated May 18, 2020 for Application No. 201480084006.X.
Chinese Office Action dated Feb. 19, 2021 for Application No. 201480084006.X.
Japanese Office Action dated Jul. 28, 2020 for Application No. 2019-127543.
Japanese Office Action dated Apr. 27, 2021for Application No. 2019-127543.
Korean Office Action dated Jun. 23, 2020 for Application No. 10-2019-7025762.
Chinese Notice of Allowance dated Jun. 2, 2021 for Application No. 201480084006.X.
International Search Report and Written Opinion dated Oct. 8, 2015 for Application No. PCT/EP2014/077257.
Chinese Office Action dated Sep. 19, 2018 for Application No. 201480084006.

* cited by examiner

MASK ARRANGEMENT FOR MASKING A SUBSTRATE IN A PROCESSING CHAMBER, APPARATUS FOR DEPOSITING A LAYER ON A SUBSTRATE, AND METHOD FOR ALIGNING A MASK ARRANGEMENT FOR MASKING A SUBSTRATE IN A PROCESSING CHAMBER

CROSS-REFERENCE TO RELATED APPLICATIONS

This application is a continuation of co-pending U.S. patent application Ser. No. 15/534,826, filed Dec. 10, 2014, which claims benefit of United States National Phase Application serial number PCT/EP2014/077257 filed Jun. 9, 2017. Each of the aforementioned related patent applications is herein incorporated by reference.

FIELD

Embodiments of the present disclosure relate to a mask arrangement for masking a substrate in a processing chamber, an apparatus for depositing a layer on a substrate, and a method for aligning a mask arrangement for masking a substrate in a processing chamber. Embodiments of the present disclosure particularly relate to a mask arrangement for masking a substrate in a processing chamber in a substantially vertical orientation, an apparatus for depositing a layer on a substrate in a substantially vertical orientation, and a method for aligning a mask arrangement for masking a substrate in a processing chamber in a substantially vertical orientation.

BACKGROUND

Several methods are known for depositing a material on a substrate. As an example, substrates may be coated by using an evaporation process, such as a physical vapor deposition (PVD) process, a chemical vapor deposition (CVD) process, a sputtering process, a spraying process, etc. The process can be performed in a processing chamber of a deposition apparatus, where the substrate to be coated is located. A deposition material is provided in the processing chamber. A plurality of materials, such as small molecules, metals, oxides, nitrides and carbides, may be used for deposition on a substrate. Further, other processes like etching, structuring, annealing, or the like can be conducted in processing chambers.

Coated substrates may be used in several applications and in several technical fields. For instance, an application lies in the field of organic light emitting diode (OLED) panels. Further applications include insulating panels, microelectronics, such as semiconductor devices, substrates with TFT, color filters or the like.

OLEDs are solid-state devices composed of thin films of (organic) molecules that create light with the application of electricity. OLEDs can provide bright displays on electronic devices and use less power than for instance light-emitting diodes (LEDs) or liquid crystal displays (LCDs). In the processing chamber, the organic molecules are generated (e.g., evaporated, sputtered, or sprayed etc.) and allowed to condense as thin films on the substrates. The particles pass through a mask having a specific pattern to form an OLED pattern on the substrate.

In order to reduce a footprint of deposition apparatuses, there are deposition apparatuses that allow for processing of a masked substrate in a vertical orientation. In other words, the substrate and the mask arrangement are vertically arranged within the processing chamber. When the mask arrangement is vertically oriented, the force of gravity can lead to a deformation or bending of the mask arrangement, resulting in a reduced quality of the processed substrate, and in particular of the deposited film or layer.

In view of the above, a new mask arrangement for masking a substrate in a processing chamber, an apparatus for depositing a layer on a substrate, and a method for aligning a mask arrangement for masking a substrate in a processing chamber, which overcome at least some of the problems in the art, are needed. In particular, there is a need for a mask arrangement, an apparatus for depositing a layer on a substrate, and a method for aligning a mask arrangement that allows for a reduction or even an avoidance of a deformation or bending of the mask arrangement, in particular when the mask arrangement is in a vertical orientation.

SUMMARY

In light of the above, a mask arrangement for masking a substrate in a processing chamber, an apparatus for depositing a layer on a substrate, and a method for aligning a mask arrangement for masking a substrate in a processing chamber are provided. Further aspects, benefits, and features of the present disclosure are apparent from the claims, the description, and the accompanying drawings.

According to an aspect of the present disclosure, a mask arrangement for masking a substrate in a processing chamber is provided. The mask arrangement includes a mask frame having one or more frame elements and is configured to support a mask device, wherein the mask device is connectable to the mask frame; and at least one actuator connectable to at least one frame element of the one or more frame elements, wherein the at least one actuator is configured to apply a force to the at least one frame element.

According to an aspect of the present disclosure, a mask arrangement for masking a substrate in a processing chamber is provided. The mask arrangement includes a mask frame having one or more frame elements and is configured to support a mask device, wherein the mask device is connectable to the mask frame; and at least one actuator connectable to at least one frame element of the one or more frame elements, wherein the at least one actuator is configured to apply a force to the at least one frame element, wherein the at least one frame element includes a first frame element and a second frame element, wherein the at least one actuator is connectable to the first frame element and the second frame element. The at least one actuator includes a first actuator and a second actuator, wherein the first actuator is connectable to the first frame element, wherein the first actuator is configured to apply a first force to the first frame element, wherein the second actuator is connectable to the second frame element, and wherein the second actuator is configured to apply a second force to the second frame element, in particular wherein the first force and the second force point in opposite directions.

According to still another aspect of the present disclosure, an apparatus for depositing a layer on a substrate is provided. The apparatus includes a processing chamber adapted for layer deposition therein; a mask arrangement as described herein within the processing chamber; and a deposition source for depositing material forming the layer.

According to yet another aspect of the present disclosure, a method for aligning a mask arrangement for masking a substrate in a processing chamber is provided. The method includes applying a force to at least one frame element of a mask frame supporting a mask device.

Embodiments are also directed at apparatuses for carrying out the disclosed methods and include apparatus parts for performing each described method aspect. These method aspects may be performed by way of hardware components, a computer programmed by appropriate software, by any combination of the two or in any other manner. Furthermore, embodiments according to the present disclosure are also directed at methods for operating the described apparatus. It includes method aspects for carrying out every function of the apparatus.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following:

FIGS. 7B and C show the section of the mask frame wherein a force is applied to the at least one frame element;

DETAILED DESCRIPTION OF EMBODIMENTS

Reference will now be made in detail to the various embodiments of the disclosure, one or more examples of which are illustrated in the figures. Within the following description of the drawings, the same reference numbers refer to same components. Generally, only the differences with respect to individual embodiments are described. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

Figure 1:
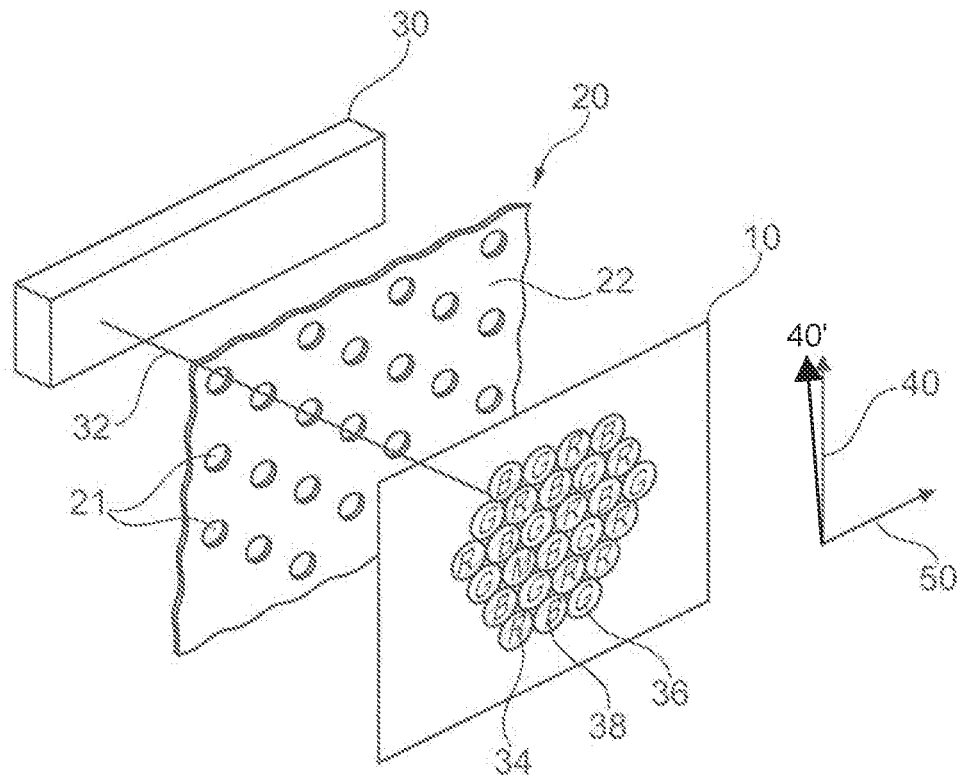
FIG. 1 shows a schematic view of a deposition process using a mask device for manufacturing OLEDs on a substrate.

FIG. 1 shows a schematic view of a deposition process for manufacturing OLEDs on a substrate 10.

For manufacturing OLEDs, organic molecules are generated by a deposition source 30 (e.g., evaporated, sputtered, sprayed etc.) and deposited on the substrate 10. A mask arrangement 20 including a mask device 22 is positioned between the substrate 10 and the deposition source 30. The mask device 22 has a specific pattern, e.g., provided by a plurality of openings or holes 21, so that organic molecules pass through the openings or holes 21 (e.g., along a path 32) to deposit a layer or film of an organic compound on the substrate 10. A plurality of layers or films can be deposited on the substrate 10 using different masks or positions of the mask device 22 with respect to the substrate 10, e.g., to generate pixels with different color characteristics. As an example, a first layer or film can be deposited to generate red pixels 34, a second layer or film can be deposited to generate green pixels 36, and a third layer or film can be deposited to generate blue pixels 38. The layer(s) or film(s), e.g., an organic semiconductor, can be arranged between two electrodes, such as an anode and a cathode (not shown). At least one electrode of the two electrodes can be transparent.

The substrate 10 and the mask device 22 can be arranged in a vertical orientation during the deposition process. In FIG. 1, arrows indicate a vertical direction 40 and a horizontal direction 50.

As used throughout the present disclosure, the term "vertical direction" or "vertical orientation" is understood to distinguish over "horizontal direction" or "horizontal orientation". That is, the "vertical direction" (e.g., vertical direction 40) or "vertical orientation" relates to a substantially vertical orientation, e.g., of the mask arrangement/mask and the substrate, wherein a deviation of a few degrees, e.g., up to 10 degrees or even up to 15 degrees, from an exact vertical direction 40' or vertical orientation is still considered as a "substantially vertical direction" or a "substantially vertical orientation". The vertical direction 40 can be substantially parallel to the force of gravity, e.g., within the deviation of the few degrees from the exact direction 40' of the force of gravity.

Figure 2A:
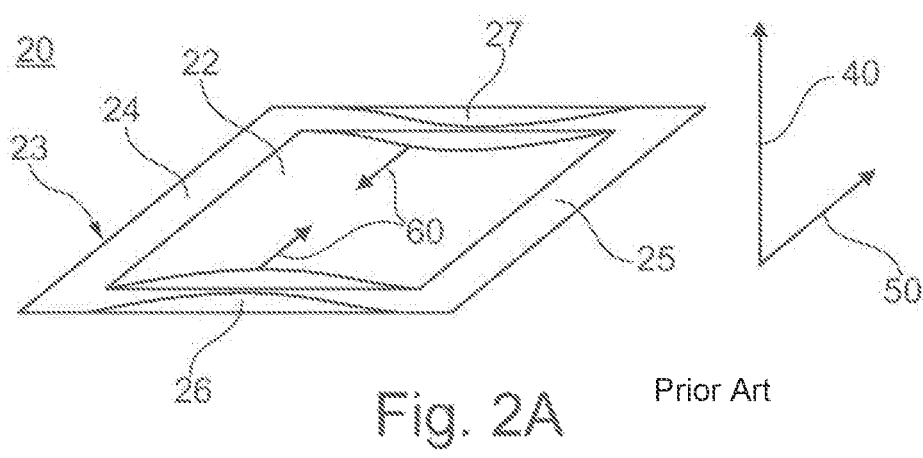
FIGS. 2A and 2B show schematic views of a mask arrangement in a horizontal orientation and a vertical orientation, respectively.
Figure 2B:
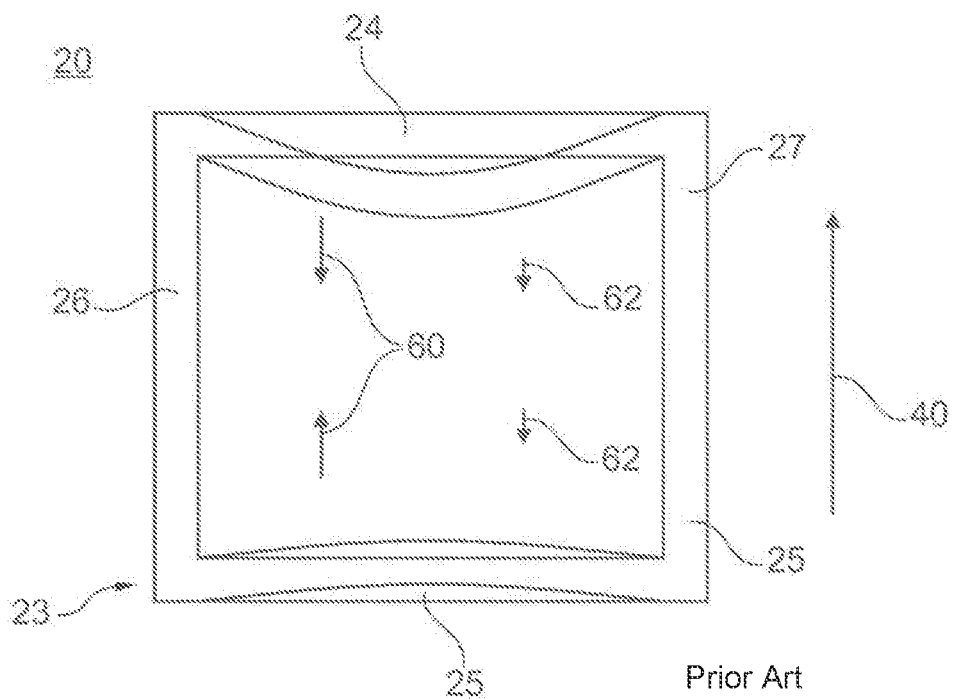

FIG. 2A shows a schematic view of a mask arrangement 20 in a horizontal orientation. FIG. 2B shows a schematic view of the mask arrangement 20 of FIG. 2A in a vertical orientation.

In some implementations, the mask arrangement 20 is assembled by connecting a mask device 22 to a mask frame 23. The mask frame 23 can have one or more frame elements, such as a first frame element 24, a second frame element 25, a third frame element 26 and a fourth frame element 27. As an example, the connecting the mask device 22 to the mask frame 23 may include a welding process, and in particular spot welding. The assembling of the mask arrangement 20 can be done with the mask device 22, the mask frame 23 and optionally the substrate in a horizontal orientation, as it is shown in FIG. 2A.

Before, during or after the assembling of the mask arrangement 20, the substrate can be positioned and fixed with respect to the mask arrangement 20 or mask device 22. Further devices such as at least one of a carrier, a substrate frame and a substrate holding arrangement can be provided and used in positioning and fixing the substrate.

The mask device 22 can be connected to the mask frame 23 by welding, e.g., spot welding. Tension forces can be present, as it is indicated with reference numeral 60. Tension forces can be provided to manage thermal expansion of the mask e.g. during a deposition process. If there is sufficient tension, a temperature growth does not change pixel position but only the mask tension.

After assembling of the mask arrangement 20, e.g., by connecting the mask device 22 and the mask frame 23, the mask arrangement 20 can be brought into an upright position, i.e., the vertical orientation, for the deposition process.

FIG. 2B shows the mask arrangement 20 in the vertical orientation. The force of gravity now acts on the mask arrangement 20 in a substantially vertical direction (indicated with reference numeral 62) and leads to a deformation or bending of at least a part of the mask frame 23 and/or the mask device 22. The force of gravity may in particular lead to a deformation or bending of horizontally oriented frame elements, such as the first frame element 24 and the second frame element 25 (indicated with the solid lines). As an example, with a mask thickness of about 50 micrometers, a vertical deformation can be at least 2.5 micrometers (a mask positioning precision can be about 2 micrometers). The mask device 22 can in particular be deformed due to its connection to the mask frame 23. The deformation in turn leads to a misalignment of the mask device 22 with respect to the substrate, and a quality and/or an alignment of the deposited layer(s) is deteriorated.

Figure 3:
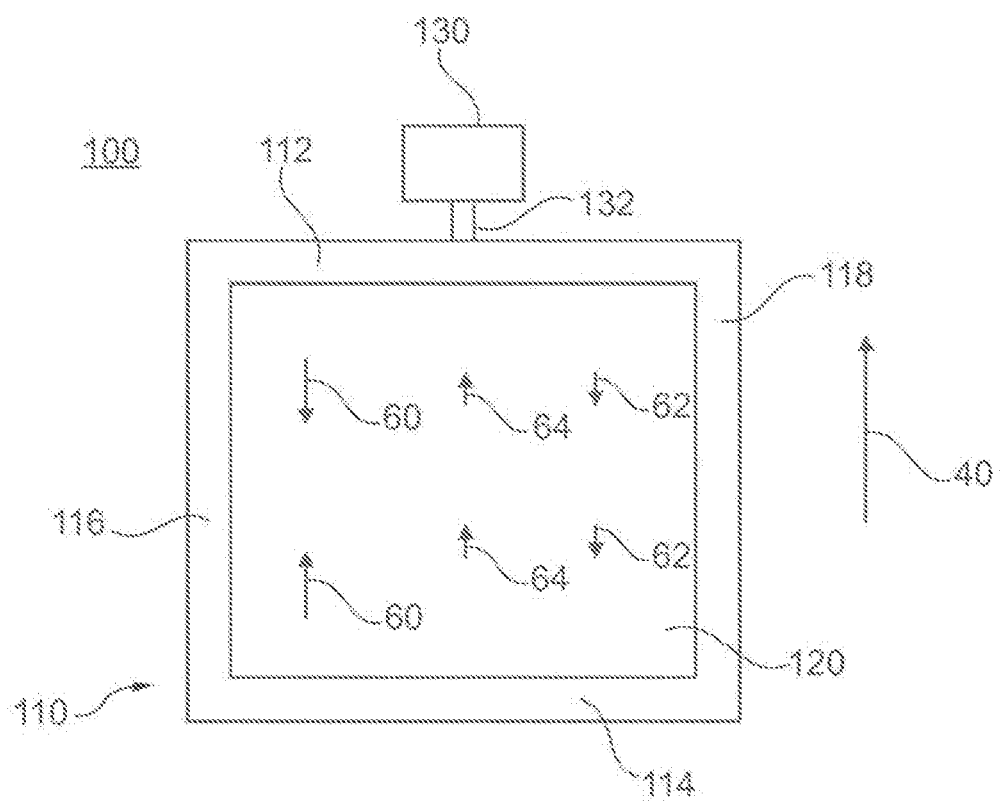
FIG. 3 shows a schematic view of a mask arrangement for masking a substrate in a processing chamber according to embodiments described herein.

FIG. 3 shows a schematic view of a mask arrangement 100 for masking a substrate in a processing chamber, in particular a vacuum processing chamber or a vacuum deposition chamber, according to embodiments described herein.

According to an aspect of the present disclosure, the mask arrangement 100 includes a mask frame 110 having one or more frame elements and configured to support a mask device 120, wherein the mask device 120 is connectable to the mask frame 110; and at least one actuator 130 connectable to at least one frame element of the one or more frame elements, wherein the at least one actuator 130 is configured to apply a force 64 to the at least one frame element. In some implementations, the mask frame 110 can be configured as a carrier for moving the mask.

According to some embodiments, which can be combined with other embodiments described herein, the mask frame 110 is configured to support the mask device 120 in a substantially vertical orientation. The at least one actuator 130 can be connected to the at least one frame element using a connection device 132, such as a clamp.

According to some embodiments, which can be combined with other embodiments described herein, the at least one actuator 130 is configured to apply the force in the substantially vertical direction 40 when the mask arrangement 100 is in the vertical orientation. As an example, the at least one actuator 130 is configured to apply the force in a direction substantially parallel to the force of gravity, and in particular in a direction opposite to the force of gravity. In some embodiments, applying the force to the at least one frame element can include pushing or pulling the at least one frame element, e.g., in the vertical direction. According to some embodiments, the at least one actuator 130 is configured to apply the force to the at least one frame element to move or displace the at least one frame element. As an example, the at least one actuator 130 can be configured to apply the force with a fixed magnitude ("fixed force") and/or to apply a fixed amount of displacement or deformation to the at least one frame element.

The mask arrangement 100 of the present disclosure allows for a correction or compensation of a deformation or bending of the mask frame 110 by applying the force to the at least one frame element. In particular, the force allows for a correction or compensation of a deformation or bending of the mask frame 110 due to the force of gravity, e.g., when the mask arrangement 100 is in an upright or vertical orientation. In some implementations, the force 64 can also be referred to as "compensation force" or "gravity compensation force". By applying the force and the correction or compensation of the deformation or bending of the mask frame 110, the alignment of the mask device 120 with respect to the substrate can be adjusted, and a quality and/or an alignment of the deposited layer(s) can be improved.

According to some embodiments, which can be combined with other embodiments described herein, the one or more frame elements may define an aperture opening configured for accommodating the mask device 120. The one or more frame elements can provide a mask support surface configured for supporting the mask device 120. In some implementations, the one or more frame elements can be separate elements that are connectable to form the mask frame 110, or can be integrally formed. In some embodiments, the mask frame 110 can have a substantially rectangular shape.

In some implementations, the one or more frame elements include a first frame element 112, a second frame element 114, a third frame element 116, and a fourth frame element 118. As an example, the first frame element 112 and the second frame element 114 can be referred to as top bar and bottom bar, respectively. The first frame element 112 and the second frame element 114 can also be referred to as horizontal frame elements. The third frame element 116 and the fourth frame element 118 can be referred to as sidebars or vertical frame elements. In some embodiments, the first frame element 112 and the second frame element 114 are arranged in parallel, and/or the third frame element 116 and the fourth frame element 118 are arranged in parallel.

According to some embodiments, the at least one frame element can be a horizontal frame element when the mask frame 110 is in the substantially vertical orientation. The at least one frame element can in particular be the first frame element 112, e.g., the top bar, and/or the at least one frame element can be the second frame element 114, e.g., the bottom bar.

According to some embodiments, which can be combined with other embodiments described herein, the at least one frame element includes the first frame element 112 and the second frame element 114, wherein the at least one actuator 130 is connectable to the first frame element 112 and the second frame element 114. The at least one actuator 130 is configured to apply the force to the first frame element 112 and the second frame element 114, in particular simultaneously. In other words, one actuator is connectable to both, the first frame element 112 and the second frame element 114.

In some implementations, the one or more frame elements can define a plane, wherein the at least one actuator 130 is configured to apply the force in a direction substantially parallel to the plane, and in particular wherein the plane is a vertical plane when the mask frame 110 is in the substantially vertical orientation. The plane can be substantially parallel to a substrate surface configured for deposition of the deposition material thereon. The plane can be substantially parallel to a surface of the mask device 120 having openings or holes configured for letting pass the deposition material (e.g., denoted with reference numeral 21 in FIG. 1)

According to some embodiments, which can be combined with other embodiments described herein, the at least one frame element has a longitudinal extension. A direction of the longitudinal extension can be substantially parallel to the horizontal direction when the mask frame 110 is in the substantially vertical orientation. In some implementations, the at least one actuator 130 is configured to apply the force in a direction substantially perpendicular to the direction of the longitudinal extension.

The term "substantially perpendicular" relates to a substantially perpendicular orientation, e.g. of the force and the at least one frame element, wherein a deviation of a few degrees, e.g. up to 10.degree. or even up to 15.degree., from an exact perpendicular orientation is still considered as "substantially perpendicular". The term "substantially parallel" relates to a substantially parallel orientation e.g. of frame elements, wherein a deviation of a few degrees, e.g. up to 10.degree. or even up to 15.degree., from an exact parallel orientation is still considered as "substantially parallel".

The mask arrangement 100 of the present disclosure allows for a compensation of an effect of the force of gravity acting on the mask arrangement 100 being arranged in a substantially vertical orientation. A deformation or bending of the mask frame 110 and/or the mask device 120 due to the force of gravity can be compensated or corrected, resulting in an improved quality and alignment of the layer deposited on the substrate.

Figure 4A:
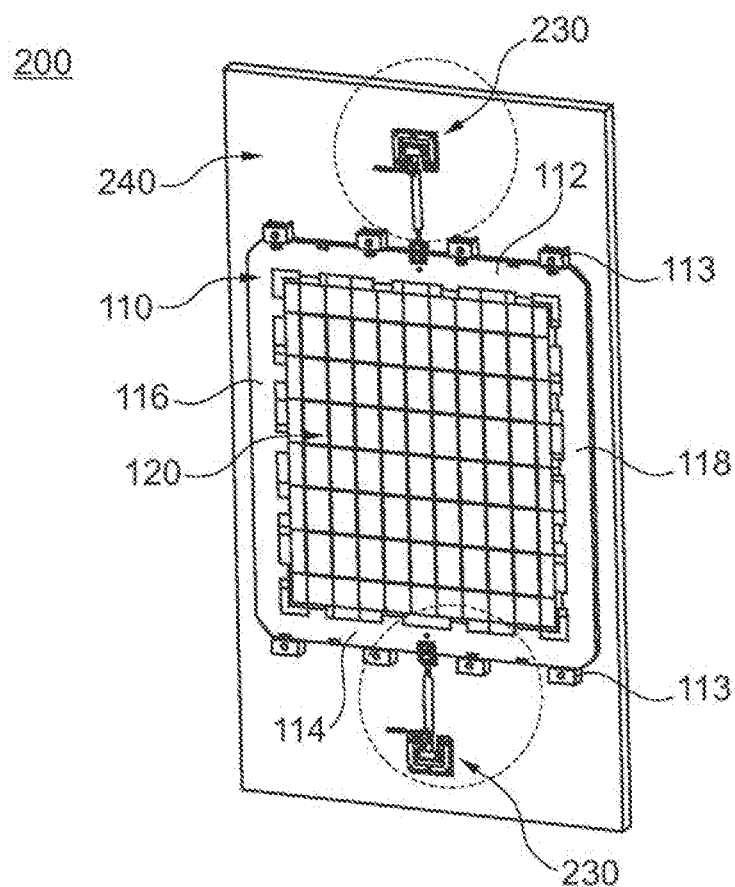
FIG. 4A shows a schematic view of a mask arrangement for masking a substrate in a processing chamber according to further embodiments described herein.
Figure 4B:
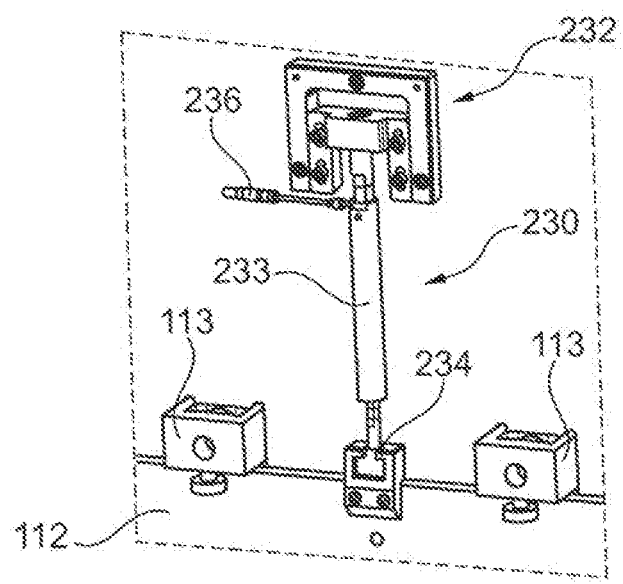
FIG. 4B shows a schematic view of an actuator of the mask arrangement of FIG. 4A according to embodiments described herein.

FIG. 4A shows a schematic view of a mask arrangement 200 for masking a substrate in a processing chamber (not shown) according to further embodiments described herein. FIG. 4B shows a schematic view of an actuator 230 of the mask arrangement 200 of FIG. 4A according to embodiments described herein.

According to some embodiments, which can be combined with other embodiments described herein, the at least one actuator 230 includes a first actuator and a second actuator, wherein the first actuator is connectable to the first frame element 112, wherein the first actuator is configured to apply a first force to the first frame element 112, wherein the second actuator is connectable to the second frame element 114, and wherein the second actuator is configured to apply a second force to the second frame element 114. By providing the first actuator and the second actuator, forces can be individually applied to the first frame element 112 and the second frame element 114, and the deformation of the mask frame 110 can be precisely compensated or corrected. In the example of FIG. 4A, the first actuator is connected to the top bar of the mask frame 110, and the second actuator is connected to the bottom bar of the mask frame 110. In some implementations, the first actuator is configured to pull the first frame element 112, e.g., the top bar. The second actuator can be configured to push the second frame element 114, e.g., the bottom bar. By pulling and pushing the top bar and the bottom bar, respectively, the original mask frame conditions can be restored.

In some implementations, the mask arrangement 200 includes a mask frame support 240 configured to support the mask frame 110. The mask frame support 240 can for instance be a plate. According to some embodiments, the third frame element 116 and/or the fourth frame element 118 of the mask frame 110 can be connected to the mask frame support 240 e.g. by screws and/or or clamps. As an example, the first frame element 112 and/or the second frame element 114 cannot be connected to the mask frame support 240. In other words, the first frame element 112 and/or the second frame element 114 can be free or loose, so that the force applied to the first frame element 112 and/or the second frame element 114 can move or displace the first frame element 112 and/or the second frame element 114 to compensate or correct the deformation. The mask frame 110 can in particular be detachably connected to the mask frame support 240. Additionally or alternatively, the mask frame 110 can be connected to, or hold at, the mask frame support 240, e.g., using one or more holding devices 113. The one or more holding devices 113 may include at least one of screws, clamps etc.

According to some embodiments, which can be combined with other embodiments described herein, the at least one actuator 230 can include at least one of a motor, a stepper motor, a linear motor, a linear actuator, a piezoelectric actuator, an adjustment screw, an elastic element, and a spring. In particular, the at least one actuator 230 can be a manual actuator, or can be an automatic actuator. According to some embodiments, which can be combined with other embodiments described herein, the at least one actuator 230 is mounted on the mask frame support 240.

In the following, the at least one actuator is described with reference to the at least one actuator being connected to the first frame element 112, e.g., the top bar. The same description applies to the at least one actuator being connected to the second frame element 114, e.g., the bottom bar, and is not repeated.

According to some embodiments, which can be combined with other embodiments described herein, the at least one actuator 230 includes a linear actuator 233 and at least one adjustment device 236. In the example illustrated in FIG. 4B, the at least one actuator 230 includes a first fixing device 232 and a second fixing device 234. The first fixing device 232 can be configured for fixing the at least one actuator 230 to the mask frame support 240. The second fixing device 234 can be configured for fixing the at least one actuator 230 to the at least one frame element such as the first frame element 112 or top bar of the mask frame 110. The second fixing device 234 can include at least one of a screw, a clamp, or a combination thereof.

The linear actuator 233 can be configured for applying the force to the at least one frame element. The at least one adjustment device 236 can be configured for adjusting the force applied to the at least one frame element. As an example, the at least one adjustment device 236 can be configured to change or vary an extension length of the linear actuator 233. By varying or changing the extension length of the linear actuator 233, the force applied to the at least one frame element can be varied or changed. In some implementations, the extension length of the linear actuator 233 extends in a direction substantially perpendicular to the direction of the longitudinal extension of the at least one frame element. In particular, the extension length of the linear actuator 233 extends in the substantially vertical direction when the mask frame 110 and the mask device 120 are in the substantially vertical orientation.

According to some embodiments, the at least one adjustment device 236 can be a manual adjustment device or can be an automatic adjustment device. The at least one adjustment device 236 can include at least one of a motor, a stepper motor, and an adjustment screw.

Although the at least one actuator 230 is shown as being mounted on the mask frame support 240, it is to be understood that the present disclosure is not limited thereto. The at least one actuator 230 could be provided at other locations of the mask arrangement. As an example, the at least one actuator 230 could be in a hidden position (i.e., the at least one actuator 230 could not be visible from the outside), could be embedded in the mask frame support 240, and/or could be embedded in the mask frame.

Figure 5A:
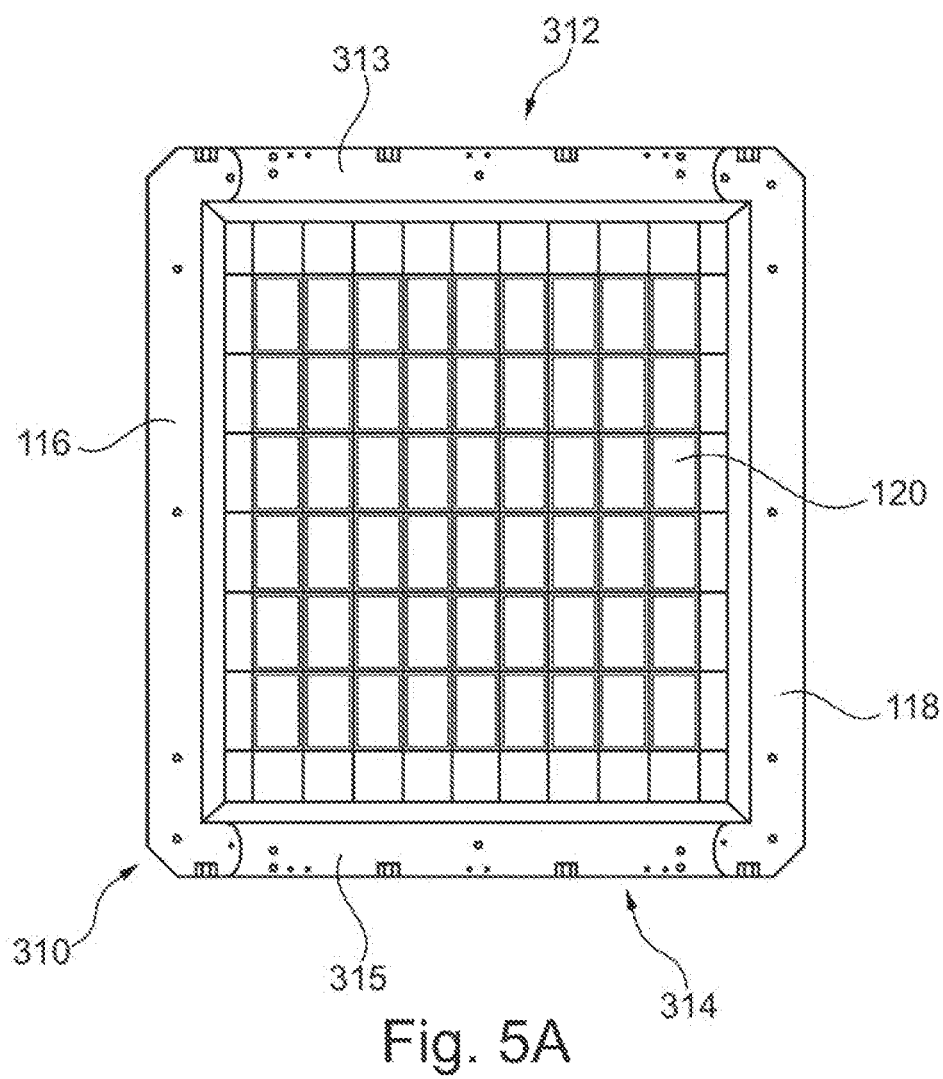
FIGS. 5A and 5B show schematic views of a mask frame of a mask arrangement for masking a substrate in a processing chamber according to yet further embodiments described herein.
Figure 5B:
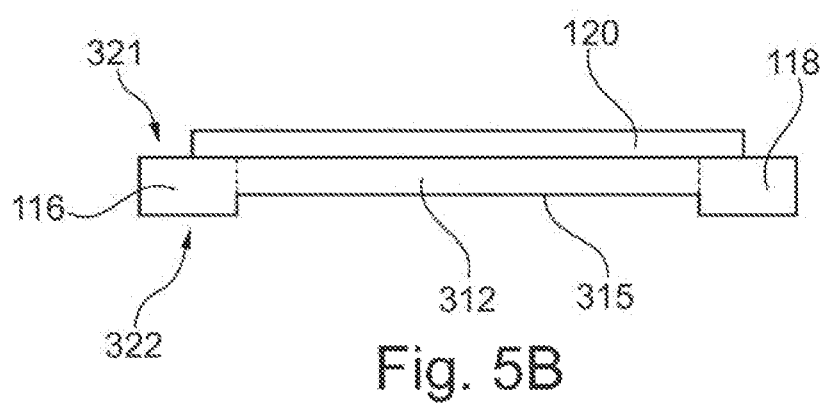

FIGS. 5A and 5B show schematic views of a mask frame 310 and a mask device 120 of a mask arrangement for masking a substrate in a processing chamber according to further embodiments described herein.

According to some embodiments, which can be combined with other embodiments described herein, the one or more frame elements of the mask frame 310 provide a first side 321 configured to support the mask device 120 and a second side 322 configured to face the mask frame support (not shown), wherein the mask frame 310 is connectable to the mask frame support. The first side 321 can be referred to as the "front side" of the mask frame 310, and the second side 322 can be referred to as the "back side" of the mask frame 310. In some implementations, the first side 321 provides a mask support surface configured to support the mask device 120, and in particular an edge portion of the mask device 120.

According to some embodiments, which can be combined with other embodiments described herein, the mask arrangement includes one or more recesses. The one or more recesses can be provided at the mask frame 310 and/or at the mask frame support (not shown). The one or more recesses can be provided at locations where the mask frame 310 and the mask frame support face each other. In other words, the mask frame 310 and the mask frame support do not contact each other at locations where the one or more recesses are provided. As an example, the one or more recesses are provided at the at least one frame element or at a region of the mask frame support corresponding to (or facing) the at least one frame element.

In some embodiments, a surface of the second side 322 includes the one or more recesses. As an example, the one or more recesses are provided at the at least one frame element. As illustrated in FIG. 5A, a first recess 313 of the one or more recesses is provided at the first frame element 312, and a second recess 315 of the one or more recesses is provided at the second frame element 314. The one or more recesses can extend over at least a part of a surface area of the surface of the second side 322, specifically over at least 50 percent of the surface area, and more specifically over 70 to 90 percent of the surface area. In some embodiments, the one or more recesses can extend over substantially the whole surface area of the surface of the second side 322. The one or more recesses can be formed by removing material from the respective frame element, and in particular from the frame element(s) to which the at least one actuator is connected. A depth of the one or more recesses can be 10 to 1000 micro meters, and specifically 50 to 500 micro meters. As an example, the material removed can be as thin as possible.

Providing the one or more recesses reduces or even avoids a contact and/or scratching between surfaces, in particular between the mask frame 310 (frame rear surface) and the mask frame support (front support surface). Scratching can particularly be avoided when the actuator applies the force to the at least one frame element to move or displace the at least one frame element. By reducing or even avoiding the contact and/or scratching between the surfaces, a particle generation can be minimized or even prevented, resulting in an improved quality of the deposited layers. In other words, a contamination of the deposited layers with particles generated by scratching surfaces can be minimized or even avoided.

Figure 6:
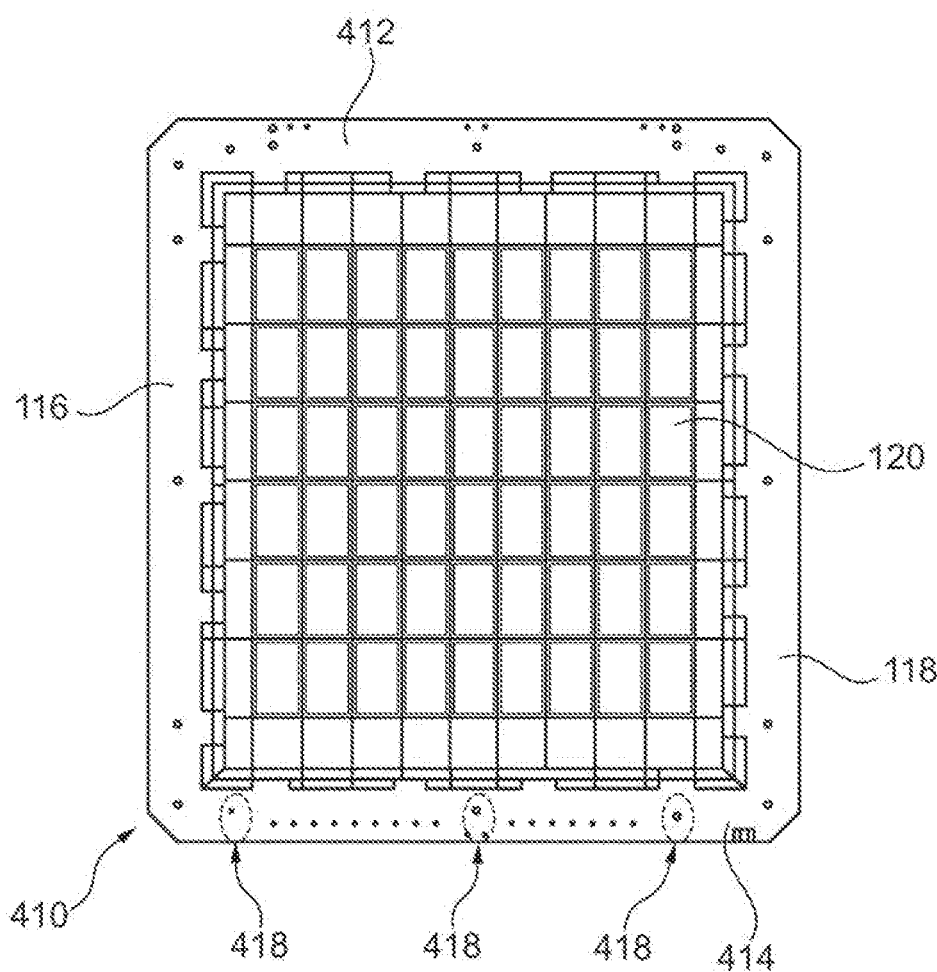
FIG. 6 shows a schematic view of a mask frame of a mask arrangement for masking a substrate in a processing chamber according to still further embodiments described herein.
Figure 7A:
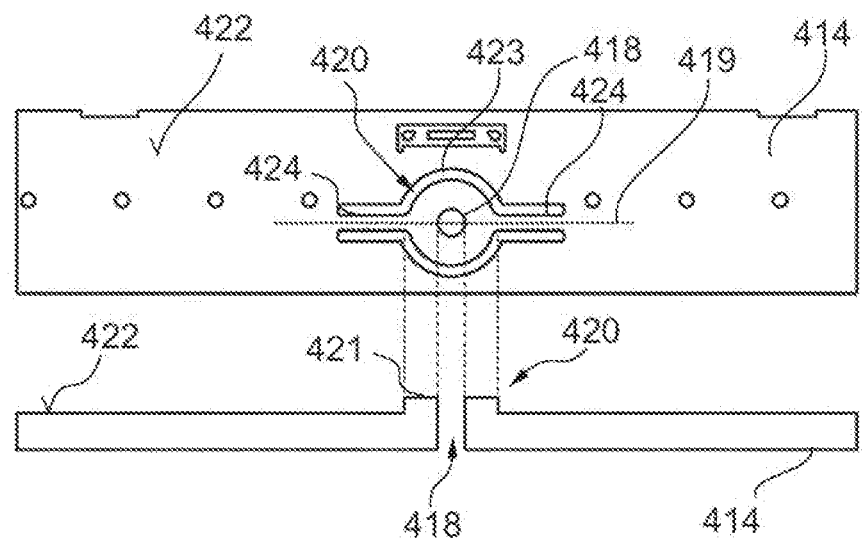
FIGS. 7A-C show schematic views of a section of the mask frame of FIG. 6 having one or more protrusions.
Figure 7B:
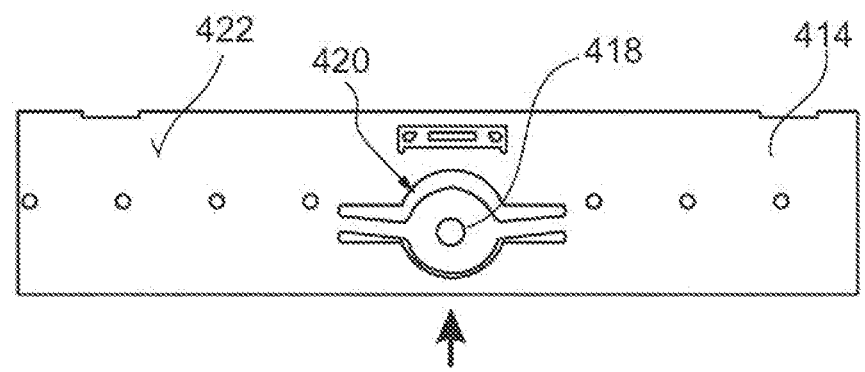
Figure 7C:
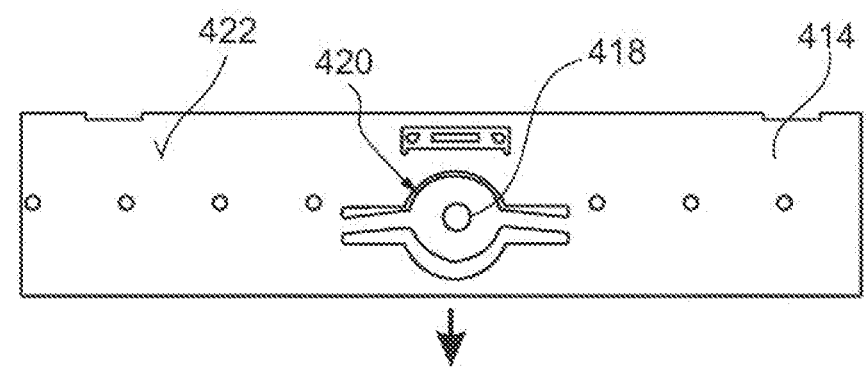

FIG. 6 shows a schematic view of a mask frame 410 of a mask arrangement for masking a substrate in a processing chamber according to still further embodiments described herein. FIGS. 7A-C show schematic views of the mask frame 410 of FIG. 6. In particular, FIG. 7A shows a plan view of a section of the second frame element 414 of the mask frame 410 (upper section of FIG. 7A) and a cross sectional view along line 419 (lower section of FIG. 7A). FIGS. 7B and C show the section of the second frame element 414 wherein a force is applied to the second frame element 414. The embodiment of FIGS. 6 and 7 is similar to the embodiment of FIG. 5, and the description of similar or identical features and elements is not repeated.

According to some embodiments, which can be combined with other embodiments described herein, the one or more frame elements of the mask frame 410 provide a first side configured to support the mask device 120 and a second side 422 configured to face the mask frame support, wherein the mask frame 410 is connectable to the mask frame support (not shown).

According to some embodiments, which can be combined with other embodiments described herein, the mask arrangement includes one or more protrusions or spacers 420. The one or more protrusions or spacers 420 can be provided at least one of the mask frame 410 and the mask frame support, and can be provided as separate spacers positionable between the mask frame 410 and the mask frame support. The one or more protrusions or spacers 420 can be provided at locations where the mask frame 410 and the mask frame support face each other. In some embodiments, the mask frame 410 and the mask frame support do only contact each other at locations where the one or more protrusions or spacers 420 are provided. As an example, the one or more protrusions or spacers 420 are provided at the at least one frame element or at a region of the mask frame support corresponding to (or facing) a region or position of the at least one frame element. According to some embodiments, at least three protrusions or spacers are provided, more specifically six protrusions or spacers are provided. As an example, three protrusions or spacers can be provided at the first frame element 412, and/or three protrusions or spacers can be provided at the second frame element 414.

In some implementations, a surface of the at least one frame element, and in particular the horizontal frame elements such as the first frame element 412 and/or the second frame element 414, includes the one or more protrusions or spacers 420. The one or more protrusions or spacers 420 can include a contact region or contact area 421 configured for contacting the mask frame support. In some embodiments, the one or more protrusions or spacers 420 are provided at the at least one frame element, such as the first frame element 412 (e.g., the top bar) and/or at the second frame element 414 (e.g., the bottom bar). In some implementations, the first frame element 412 includes two or more protrusions or spacers 420, more specifically three protrusions or spacers 420. The second frame element 414 can include two or more protrusions or spacers 420, more specifically three protrusions or spacers 420.

According to some embodiments, which can be combined with other embodiments described herein, the one or more protrusions or spacers 420 can include at least one through hole 418. The at least one through hole 418 can for instance be used for fixing the mask frame 410 to the mask frame support, e.g., by using screws. By providing the at least one through hole 418, the at least one frame element (and/or mask frame) can be kept flat e.g. at the mask frame support, while the at least one frame element is still moveable by the at least one actuator. In some implementations, each protrusion or spacer of the one or more protrusions or spacers 420 includes one through hole 418. In some embodiments, the protrusion or spacer 420 surrounds the at least one through hole 418. As an example, the protrusion or spacer 420 can have a cylindrical shape, e.g., with the cylinder axis corresponding to an axis of the at least one through hole 418.

According to some embodiments, the mask arrangement includes at least one fixing hole, e.g., at least one threaded fixing hole. The at least one fixing hole can be provided at positions corresponding to the at least one through hole 418. The at least one fixing hole can be configured for an engagement with a screw passing through a corresponding through hole of the at least one through hole 418 for fixing the mask frame 410 to the mask frame support. As an example, when the at least one through hole 418 (and the protrusion or spacer 420) is provided at the mask frame, the at least one fixing hole can be provided in the mask frame support, and in particular at a position of the mask frame support corresponding to a position of the at least one through hole 418. In other examples, when the at least one through hole 418 (and the protrusion or spacer 420) is provided at the mask frame support, the at least one fixing hole can be provided in the mask frame, and in particular at a position of the mask frame corresponding to a position of the at least one through hole 418. The at least one fixing hole can be a through hole or a hole which is closed on one end.

According to some embodiments, which can be combined with other embodiments described herein, the mask arrangement includes one or more cutouts 423. As an example, the one or more cutouts 423 are provided in the at least one frame element and/or the mask frame support. The one or more cutouts 423 can be configured as openings and/or as through holes. As an example, the one or more cutouts 423 can at least partially surround the one or more protrusions or spacers 420. In the example of FIGS. 7A-C, two cutouts surround the protrusion or spacer 420. The protrusion or spacer 420 can be connected to the at least one frame element by one or more elastic elements, such as bridges 424 or horizontal arms. In some implementations, the one or more protrusions or spacers 420 and the one or more cutouts 423 can be referred to as "flexible ear".

By providing the one or more cutouts 423, the at least one frame element is moveable with respect to the one or more protrusions or spacer 420, as it is shown in FIGS. 7B and 7C. As an example, the at least one frame element can be fixed or mounted to the mask frame support e.g. by using screws and the at least one through hole 418, while the at least one frame element is still moveable. In other words, the force applied to the at least one frame element can move or displace the at least one frame element, as it is for instance shown in FIGS. 7B and C. In FIG. 7B, the force pushes the at least one mask frame element, as it is indicated with the arrow. In FIG. 7C, the force pulls the at least one mask frame element, as it is indicated with the arrow. This allows the force applied to the at least one frame element to displace or move the at least one frame elements for compensating or correcting the deformation.

Providing the at least one protrusion or spacer reduces a contact and/or scratching between surfaces to a minimum, in particular between the mask frame 410 (frame rear surface) and the mask frame support (front support surface), because only a small portion, and in particular the lateral sides, of the surface of the protrusion, e.g. close to the through hole, is in contact with the mask frame support. By reducing the contact and/or scratching between the surfaces, a particle generation can be minimized or even prevented, resulting in an improved quality of the deposited layers. In other words, a contamination of the deposited layers with particles generated by scratching surfaces can be minimized or even avoided.

Figure 8:
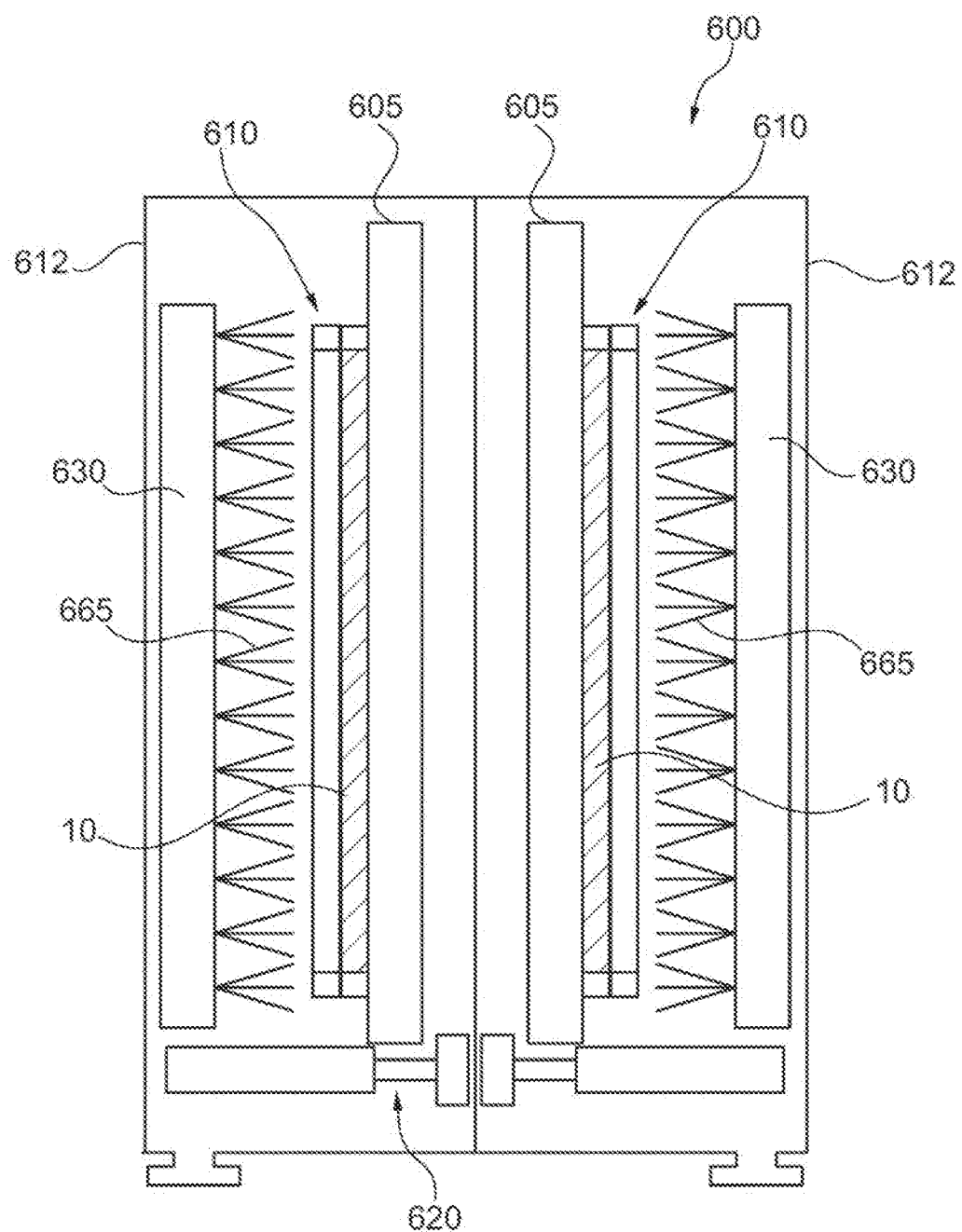
FIG. 8 shows a schematic view of an apparatus for depositing a layer on a substrate having the mask arrangement according to embodiments described herein.

FIG. 8 shows a schematic view of an apparatus 600 for depositing a layer on a substrate 10 according to embodiments described herein.

The apparatus 600 includes a processing chamber 612 adapted for layer deposition therein; a mask arrangement 610 within the processing chamber 612; and a deposition source 630 for depositing material forming the layer. The processing chamber can be a vacuum processing chamber. The mask arrangement 610 can be configured according to the embodiments described herein.

The processing chamber 612 is adapted for a deposition process, such as a thermal evaporation process, a PVD process, a CVD process, a sputter process, etc. A substrate 10 is shown being located within or at a holding arrangement or carrier 605 on a substrate transport device 620. The deposition source 630 is provided in the processing chamber 612 facing the side of the substrate 10 to be coated. The deposition source 630 provides deposition material to be deposited on the substrate 10.

The deposition source 630 may be a target with deposition material thereon or any other arrangement allowing material to be released for deposition on substrate 10. In some embodiments, the deposition source 630 may be a rotatable target. According to some embodiments, the deposition source 630 may be movable in order to position and/or replace the deposition source 630. According to other embodiments, the deposition source 630 may be a planar target. Dashed lines 665 show exemplarily the path of the deposition material during operation of the processing chamber 612.

According to some embodiments, the deposition material may be chosen according to the deposition process and the later application of the coated substrate. As an example, the deposition material can be an organic material used in the manufacturing of OLEDs. For instance, the deposition material of the deposition source 630 may be a material including small molecules, polymers, and phosphorescent materials. As an example, the deposition material can be selected from the group including: chelates (e.g., Alq.sub.3), fluorescent and phosphorescent dyes (e.g., perylene, rubrene, quinacridone derivatives, etc) and conjugated dendrimers.

The embodiments described herein can be utilized for evaporation on large area substrates. According to some embodiments, large area substrates may have a size of at least 0.67 m.sup.2. As an example, the size can be about 0.67 m.sup.2 (0.73.times.0.92 m-Gen 4.5) to about 8 m.sup.2, more specifically about 2 m.sup.2 to about 9 m.sup.2 or even up to 12 m.sup.2.

Figure 9:
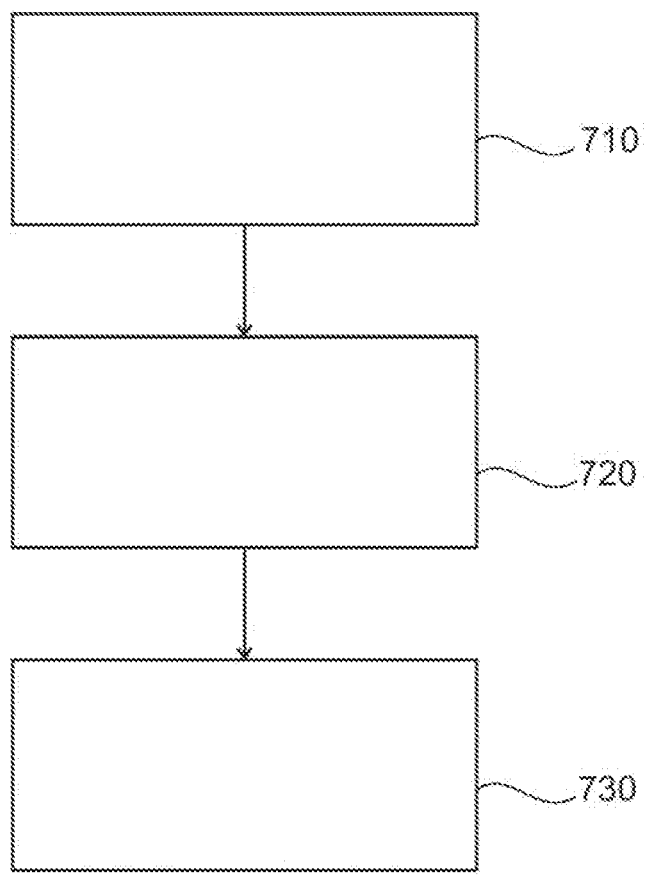
FIG. 9 shows a flow chart of a method for aligning a mask arrangement for masking a substrate in a processing chamber according to embodiments described herein.

FIG. 9 shows a flow chart of a method 700 for aligning a mask arrangement for masking a substrate in a processing chamber according to embodiments described herein.

According to an aspect of the present disclosure, the method 700 includes applying a force to at least one frame element of a mask frame supporting the mask device. The method can include further processes, as will be explained in the following example.

According to some implementations, the method includes assembling the mask arrangement in a substantially horizontal orientation (block 710). The assembling can include connecting the mask to the mask frame, e.g., by welding such as spot welding. The assembling may also include a positioning of the mask arrangement or mask device with respect to the substrate and fixing of the substrate to the mask arrangement.

In block 720, the mask arrangement and the substrate are brought into a substantially vertical orientation. In block 720, an alignment process is performed. In the alignment process, the force is applied to the at least one frame element of the mask frame to compensate the force of gravity. As an example, applying the force to the at least one frame element includes pushing or pulling the at least one frame element. In some embodiments, applying the force can include displacing or bending the at least one frame element. In some implementations, the force is applied in a substantially vertical direction when the mask frame and the mask device are in the substantially vertical orientation.

In block 730, after the alignment has been performed to compensate the effect of force of gravity to restore the original mask frame conditions, a deposition process is performed within the processing chamber. It is noted that the alignment process can be performed with the mask arrangement being located outside of the processing chamber, or with the mask arrangement being located within the processing chamber. As an example, the alignment process can be performed after the mask arrangement and the substrate have been installed in the processing chamber, and in particular just before the deposition process starts.

According to embodiments described herein, the method for aligning the mask arrangement for masking a substrate in a vacuum processing chamber can be conducted by means of computer programs, software, computer software products and the interrelated controllers, which can have a CPU, a memory, a user interface, and input and output means being in communication with the corresponding components of the apparatus for processing a substrate, e.g., a large area substrate.

The embodiments of the present disclosure allow for a compensation of an effect of the force of gravity acting on a mask arrangement in a substantially vertical orientation. A deformation or bending of the mask due to the force of gravity can be corrected, resulting in an improved quality and alignment of the layer deposited on the substrate.

While the foregoing is directed to embodiments of the disclosure, other and further embodiments of the disclosure may be devised without departing from the basic scope thereof, and the scope thereof is determined by the claims that follow.

The invention claimed is:

1. An apparatus for forming a pattern of deposited material on a substrate, comprising:
    a mask arrangement, comprising:
        a mask frame;
        a mask device coupled to and supported by the mask frame, wherein the mask device is configured to be disposed between the substrate and a deposition source within a processing chamber, and the mask device extending in a first direction that is at an acute angle to a second direction that is parallel to a force of gravity;
        an actuator configured to apply a gravity compensation force to the mask frame, wherein the gravity compensation force comprises a force that is applied in the first direction to the mask frame to compensate or correct for a deformation of the mask frame and the mask device caused by the force of gravity;
    a carrier having a first surface that is configured to support the mask arrangement and is parallel to the first direction; and
    a transport device that is configured to transport the mask arrangement and carrier for a process of forming the pattern of deposited material on the substrate.

2. The apparatus of claim 1, further comprising:
    a plurality of holding devices that are positioned on at least one edge of the mask frame, and are configured to hold the mask arrangement against the carrier.

3. The apparatus of claim 1, wherein the mask device has a pattern of a plurality of openings, through which material from the deposition source is deposited onto the substrate.

4. The apparatus of claim 1, wherein the mask device has a thickness of about 50 micrometers.

5. The apparatus of claim 1, wherein the actuator positions the substrate within precision of about 2 micrometers.

6. The apparatus of claim 1, wherein
    the mask device also extends in a third direction that is perpendicular to the first direction, and
    the mask device has an area of between 0.67 m$^2$ and 12 m$^2$ in a plane parallel to the first and third directions.

7. The apparatus of claim 1, wherein the mask frame further comprises:
    vertical frame elements that extend in the first direction; and
    horizontal frame elements that extend in a third direction that is perpendicular to the first direction, and wherein
        the horizontal frame elements and the vertical frame elements are each coupled to the mask device, and
        the horizontal frame elements and the vertical frame elements define an aperture opening for accommodating the mask device in a plane parallel to the first and third directions.

8. The apparatus of claim 7, wherein at least one frame element has a longitudinal extension perpendicular to the first direction, and wherein the actuator is configured to apply the force in the first direction to exert the gravity compensation force in the second direction.

9. An apparatus for forming a pattern of deposited material on a substrate, comprising:
    a mask arrangement, comprising:
        a mask frame;
        a mask device coupled to and supported by the mask frame, wherein the mask device is configured to be disposed between the substrate and a deposition source within a processing chamber, and the mask device extending in a first direction that is at an angle of less than 15 degrees from a second direction that is parallel to a force of gravity; and
        an actuator configured to apply a gravity compensation force to the mask frame, wherein the gravity compensation force comprises a force that is applied in the first direction to the mask frame to compensate or correct for a deformation of the mask frame and the mask device caused by the force of gravity;
    a carrier having a first surface that is configured to support the mask arrangement and is substantially parallel to the first direction; and
    a transport device that is configured to transport the mask arrangement and carrier for a process of forming the pattern of deposited material on the substrate.

10. The apparatus of claim 7, further comprising:
    a plurality of holding devices configured to connect the mask frame to the carrier, wherein
    the actuator is connected to one of the horizontal frame elements, and
    the one of the horizontal frame elements is movable when the actuator applies the gravity compensation force to the one of the horizontal frame elements.

11. The apparatus of claim 10, wherein the vertical frame elements are fixed to the carrier.

12. The apparatus of claim 10, further comprising:
    a first fixing device configured to fix the actuator to the one of the horizontal frame elements; and
    a second fixing device configured to fix the actuator to the carrier.

13. The apparatus of claim 9, wherein the mask device has a pattern of a plurality of openings, through which material from the deposition source is deposited onto the substrate.

14. The apparatus of claim 9, wherein the mask device has a thickness of about 50 micrometers.

15. The apparatus of claim 9, wherein the actuator positions the substrate within a precision of about 2 micrometers.

16. The apparatus of claim 9, wherein
the mask device also extends in a third direction that is perpendicular to the first direction, and
the mask device has an area of between 0.67 m$^2$ and 12 m$^2$ in a plane parallel to the first and third directions.

17. The apparatus of claim 9, wherein the mask frame further comprises:
vertical frame elements that extend in the first direction; and
horizontal frame elements that extend in a third direction that is perpendicular to the first direction, and wherein
the horizontal frame elements and the vertical frame elements are each coupled to the mask device, and
the horizontal frame elements and the vertical frame elements define an aperture opening for accommodating the mask device in a plane parallel to the first and third directions.

18. The apparatus of claim 17, wherein at least one frame element has a longitudinal extension perpendicular to the first direction, and wherein the actuator is configured to apply the force in the first direction to exert the gravity compensation force in the second direction.

19. The apparatus of claim 17, further comprising:
a plurality of holding devices configured to connect the mask frame to the carrier, wherein
the actuator is connected to one of the horizontal frame elements, and
the one of the horizontal frame elements is movable when the actuator applies the gravity compensation force to the one of the horizontal frame elements.

20. The apparatus of claim 19, wherein the vertical frame elements are fixed to the carrier, and the apparatus further comprises:
a first fixing device configured to fix the actuator to the one of the horizontal frame elements; and
a second fixing device configured to fix the actuator to the carrier.

21. The apparatus of claim 19, wherein the actuator is connected to the one of the horizontal frame elements between corners of the mask frame.

22. The apparatus of claim 1, further comprising one or more recesses provided at the mask frame, the carrier, or the mask frame and the carrier, such that the mask frame and the carrier do not contact each other at respective one or more locations where the one or more recesses are provided.

23. The apparatus of claim 9, further comprising one or more recesses provided at the mask frame, the carrier, or the mask frame and the carrier, such that the mask frame and the carrier do not contact each other at respective one or more locations where the one or more recesses are provided.

* * * * *